United States Patent
Paek et al.

(10) Patent No.: US 10,003,046 B2
(45) Date of Patent: Jun. 19, 2018

(54) DISPLAY MODULE AND DISPLAY APPARATUS HAVING THE SAME

(71) Applicant: SAMSUNG ELECTRONICS CO., LTD., Suwon-si (KR)

(72) Inventors: Byung Joo Paek, Suwon-si (KR); Woo Sung In, Hwaseong-si (KR); Jun Ki Noh, Uiwang (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days. days.

(21) Appl. No.: 15/432,983

(22) Filed: Feb. 15, 2017

(65) Prior Publication Data

US 2017/0162824 A1    Jun. 8, 2017

Related U.S. Application Data

(63) Continuation of application No. 14/068,471, filed on Oct. 31, 2013, now Pat. No. 9,609,774.

(30) Foreign Application Priority Data

Oct. 31, 2012  (KR) ................. 10-2012-0122492

(51) Int. Cl.
  *F21V 7/04*     (2006.01)
  *H01L 51/52*    (2006.01)
  *H05K 7/04*     (2006.01)
  *H05K 7/20*     (2006.01)

(52) U.S. Cl.
  CPC ........ *H01L 51/5246* (2013.01); *H01L 51/529* (2013.01); *H05K 7/04* (2013.01); *H05K 7/20963* (2013.01)

(58) Field of Classification Search
  CPC ..... H01L 51/5246; H01L 51/529; H05K 7/04; H05K 7/20963
  See application file for complete search history.

(56) References Cited

U.S. PATENT DOCUMENTS

| 5,335,076 A * | 8/1994 | Reh ................... B60N 2/468 200/5 A |
| 2003/0234895 A1 | 12/2003 | Sugawara et al. |
| 2005/0105011 A1 | 5/2005 | An |
| 2005/0185111 A1 | 8/2005 | Matsuoka |

(Continued)

FOREIGN PATENT DOCUMENTS

| CN | 101387791 A | 3/2009 |
| CN | 101685209 A | 3/2010 |

(Continued)

OTHER PUBLICATIONS

Communication dated Apr. 13, 2017 issued by the Australian Patent Office in counterpart Australian Patent Application No. 2013237656.

(Continued)

*Primary Examiner* — Donald Raleigh
(74) *Attorney, Agent, or Firm* — Sughrue Mion, PLLC

(57) ABSTRACT

A bottom chassis of a display module is provided. The bottom chassis includes a bead part formed by depressing some portions of the bottom chassis toward a rear side, and a reinforcing panel attached to a front surface of the bottom chassis and spaced apart from the bead part.

16 Claims, 4 Drawing Sheets

(56) References Cited

U.S. PATENT DOCUMENTS

| | | | |
|---|---|---|---|
| 2005/0194089 A1* | 9/2005 | Phillips | H01L 51/0013 |
| | | | 156/227 |
| 2006/0066227 A1* | 3/2006 | Virnich | G02B 6/0073 |
| | | | 313/505 |
| 2006/0193120 A1 | 8/2006 | Huang | |
| 2007/0126328 A1* | 6/2007 | Cho | H05K 7/20963 |
| | | | 313/46 |
| 2008/0284940 A1 | 11/2008 | Choi | |
| 2009/0225507 A1* | 9/2009 | Sato | H05K 7/20963 |
| | | | 361/679.21 |
| 2009/0261718 A1 | 10/2009 | Ha et al. | |
| 2010/0079942 A1 | 4/2010 | Yamamoto et al. | |
| 2011/0080695 A1 | 4/2011 | Cho et al. | |
| 2011/0085107 A1 | 4/2011 | Noh et al. | |
| 2011/0110046 A1* | 5/2011 | Itoh | G02F 1/133308 |
| | | | 361/709 |
| 2012/0127390 A1 | 5/2012 | Jang et al. | |
| 2013/0057784 A1 | 3/2013 | Kuroda | |

FOREIGN PATENT DOCUMENTS

| | | |
|---|---|---|
| CN | 202229018 U | 5/2012 |
| JP | 2003-279939 A | 10/2003 |
| JP | 2005-84270 A | 3/2005 |
| JP | 2007-272860 A | 10/2007 |
| JP | 2009-69792 A | 4/2009 |
| JP | 2009-210882 A | 9/2009 |
| JP | 2009-210883 A | 9/2009 |
| JP | 2010-81280 A | 4/2010 |
| JP | 2011-90338 A | 5/2011 |

OTHER PUBLICATIONS

Communication dated Jan. 23, 2017 issued by the Mexican Patent Office (IMPI) in counterpart Mexican Application No. MX/a/2013/012560.
Communication dated Dec. 9, 2016, issued by the Australian Patent Office in counterpart Australian Patent Application No. 2013237656.
Communication dated Feb. 24, 2014, issued by the European Search Authority in counterpart European Application No. 13190881.6.
Communication dated Jun. 11, 2015, issued by the European Patent Office in counterpart European Application No. 13190881.6.
Communication dated Jul. 25, 2016, issued by the Mexican Institute of Industrial Property, in corresponding Mexican Patent Application No. MX/a/2013/012560.
Communication dated Jun. 20, 2017, issued by the State Intellectual Property Office of People's Republic of China in counterpart Application No. 201310533321.3.
Communication dated Jul. 17, 2017, issued by the European Patent Office in counterpart European Application No. 13190881.6.
Office Action dated Aug. 18, 2017, issued by the Australian Patent Office in counterpart Australian Application No. 2013237656.
Communication dated Aug. 15, 2017 by the Japanese Patent Office in counterpart Japanese Patent Application No. 2013-223043.
Communication dated Mar. 6, 2018, issued by the State Intellectual Property Office of The People's Republic of China in counterpart Chinese Patent Application No. 201310533321.3.
Communication dated Mar. 22, 2018, issued by the Indian Patent Office in counterpart Indian Patent Application No. 4610/CHE/2013.
Communication dated Apr. 17, 2018, issued by the Japanese Patent Office in counterpart Japanese Patent Application No. 2013-223043.

* cited by examiner

DISPLAY MODULE AND DISPLAY APPARATUS HAVING THE SAME

CROSS-REFERENCE TO RELATED APPLICATION

This application is a continuation of U.S. application Ser. No. 14/068,471, filed Oct. 31, 2013, which claims priority from Korean Patent Application No. 10-2012-0122492, filed on Oct. 31, 2012, in the Korean Intellectual Property Office, the disclosure of which is incorporated herein by reference in its entirety.

BACKGROUND

1. Field

Apparatuses and methods consistent with exemplary embodiments relate to a display module on which an image is displayed, and an image forming apparatus having the same.

2. Description of the Related Art

In general, a display module is an apparatus provided with a display panel which displays an image. The display module may be included in a display apparatus such as a television or a monitor.

In recent years, there is a trend of making display modules as slim as possible. Accordingly, recent developments in the related art include attempting to form display modules with a slim profile (i.e., having a small thickness).

SUMMARY

Exemplary embodiments address at least the above problems and/or disadvantages and other disadvantages not described above. Also, the exemplary embodiments are not required to overcome the disadvantages described above, and exemplary embodiments may not overcome any of the problems described above.

One or more exemplary embodiments provide a display module having a bottom chassis provided with sufficient strength while having a small thickness (i.e., a slim profile).

According to an aspect of an exemplary embodiment, there is provided a display module including: a display panel; a backlight unit disposed at a rear side of the display panel; a middle mold configured to support the display panel and the backlight unit spaced apart from each other; a top chassis provided at a front side of the middle mold, and configured to support a rim of a front side of the display panel; and a bottom chassis on which the backlight unit is installed, and which is provided at a rear side of the middle mold. The bottom chassis may include a bead part depressed toward a rear side of the bottom chassis, and a reinforcing panel attached to a front surface of the bottom chassis and spaced apart from the bead part.

The bead part may include a plurality of depressed portions of the bottom chassis.

The bead part may extend in upper and lower side directions.

The bead part may include a plurality of depressed portions of the bottom chassis that may be spaced apart from each other in left and right side directions.

The bead part may include a plurality of depressed portions of the bottom chassis that may be spaced apart from each other in left and right side directions and in upper and lower side directions.

The reinforcing panel may be attached to the bottom chassis through a double-side tape attached to a portion adjacent to the bead part of the front surface of the bottom chassis.

The display module may include a double-sided tape that attaches the reinforcing panel to the bottoms chassis. The double-sided tape may be attached to a portion adjacent to the bead part of the front surface of the bottom chassis.

The bottom chassis and the reinforcing panel may be formed of a same material.

The bottom chassis may include a rear side part forming a rear surface of the bottom chassis , and a bottom lateral side part extending from an outer side end of the rear side part to a front side of the bottom chassis; the bead part may be formed by depressing the rear side part toward a rear side of the bottom chassis; and the reinforcing panel may be attached to the rear side part.

According to an aspect of another exemplary embodiment, there is provided a display module including: a bottom chassis forming a rear surface of the display module. The bottom chassis may include: a plurality of bead parts formed by depressing portions of the bottom chassis in a regular manner, and a reinforcing panel attached to the bottom chassis and spaced apart from the bead parts.

Each of the bead parts extend in upper and lower side directions, and may be disposed in left and right side directions.

The bead parts may be spaced apart from each other in left and right side directions and upper and lower side directions.

The display module may include: a display panel configured to display an image; and a backlight unit configured to supply light to the display panel. The display panel may include a liquid crystal display panel.

The display module may include a display panel configured to display an image. The display panel may include an organic light emitting diode panel.

Accordingly to an aspect of another exemplary embodiment, there is provided a display apparatus including a display module.

Accordingly to an aspect of another exemplary embodiment, there is provided a display module including: a bottom portion including end portions and a plurality of elongated ridge portions that protrude from a rear side of the bottom portion; and a reinforcing panel including end portions and configured to attach to the end portions of the bottom portion and attach to each of the plurality of elongated ridge portions.

Each of the plurality of elongated ridge portions may be formed in parallel with the end portions.

Each of the plurality of elongated ridge portions may be spaced apart from each other.

The bottom portion and the reinforcing panel may be formed of a same material.

The display module may include: a display panel configured to display an image. The bottom portion may form a rear surface of the display module.

Accordingly to an aspect of another exemplary embodiment, there is provided a display module including: a bottom portion including end portions and a plurality of elongated ridge portions that protrude from a rear side of the bottom portion; and a reinforcing panel including end portions and configured to attach to the end portions of the bottom portion and attach to a front side of the bottom portion.

Each of the plurality of elongated ridge portions may be formed in parallel with the end portions.

Each of the plurality of elongated ridge portions may be spaced apart from each other.

The bottom portion and the reinforcing panel may be formed of a same material.

The display module may include: a display panel configured to display an image. The bottom portion may form a rear surface of the display module.

BRIEF DESCRIPTION OF THE DRAWINGS

The above and/or other aspects will become apparent and more readily appreciated from the following description of exemplary embodiments, taken in conjunction with the accompanying drawings of which.

DETAILED DESCRIPTION OF EXEMPLARY EMBODIMENTS

Figure 1:
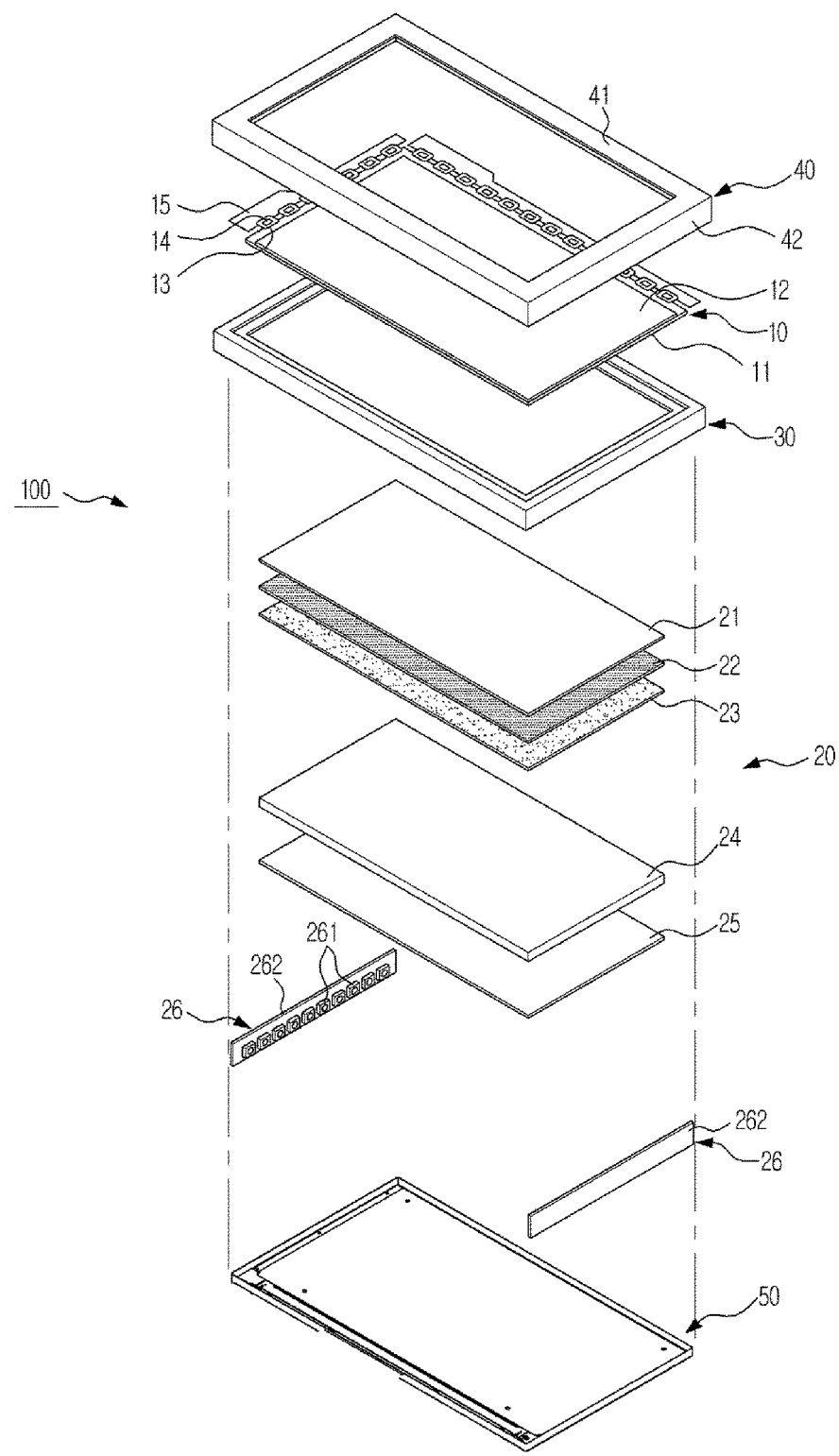
FIG. 1 is an exploded perspective view of a display module according to an exemplary embodiment.

Certain exemplary embodiments are described in greater detail with reference to the accompanying drawings.

In the following description, like drawing reference numerals are used for the same elements, even in different drawings. The matters defined in the description, such as detailed construction and elements, are provided to assist in a comprehensive understanding of the exemplary embodiments. However, exemplary embodiments can be practiced without those specifically defined matters. Also, well-known functions or constructions are not described in detail since they would obscure the exemplary embodiments with unnecessary detail.

As illustrated on FIG. 1, a display module 100 includes a display panel 10, which includes a liquid crystal display panel on which an image is displayed, a backlight unit 20 disposed at a rear side of the display panel 10 while being spaced apart from the display panel 10, a middle mold 30 to support the display panel 10 and the backlight unit 20 so that the display panel 10 and the backlight unit 20 maintain a state of being spaced apart from each other, a top chassis 40 disposed at a front side of the display panel 10, as well as at a front side of the middle mold 30, so that the display panel 10 maintains a state of being installed at the middle mold 30, and a bottom chassis 50 to accommodate the backlight unit 20 while installed at the middle mold 30 so that the backlight unit 20 is installed and supported at a rear side of the middle mold 30.

The display panel 10 includes a thin film transistor layer 11 at which a thin film transistor is formed, a color filter layer 12 facing the thin film transistor panel 11, and a liquid crystal layer (not shown) provided in between the thin film transistor layer 11 and the color filter layer 12.

At one side of the thin film transistor panel 11, a flexible printed circuit board 13, a driving chip 14 mounted on one side of the flexible printed circuit board 13, and a panel circuit board 15 connected to the other side of the flexible printed circuit board 13 are included.

The backlight unit 20 is disposed at a rear side of the display panel 10 to supply light to the display panel 10. The backlight unit 20 includes a plurality of optical sheets 21, 22, and 23 disposed at a rear side of the display panel 10, a light guiding member 24 positioned at a rear side of the optical sheets 21, 22, and 23, a reflection sheet 25 disposed at a rear surface of the light guiding member 24, and light emitting diode modules 26 disposed at both sides of the light guiding member 24 configured to emit light to the light guiding member 24.

The optical sheets 21, 22, and 23 include a protection film 21, a prism film 22, and a diffusion film 23. The protection film 21 is disposed at a front side of the prism film 22 to protect the prism film 22 which is sensitive to a scratch caused by dust. The prism film 22 is configured to collect the diffused light from the diffusion film 23 so as to be perpendicular to the display panel 10 positioned at a front side of the prism film 22, and is provided at a front surface thereof with prisms each having the shape of a triangular pillar formed in an evenly arranged manner. The diffusion film 23 supplies the light to the display panel 10 while diffusing the light delivered from the light guiding member 24.

The light guiding member 24, by diffusing the light delivered from the light emitting diode modules 26 positioned at the both sides of the light guiding member 24, evenly delivers the light toward the diffusion film 23 positioned at a front side of the light guiding member 24.

The reflection sheet 25 is disposed at a rear side of the light guiding member 24, and by reflecting the light being emitted through a rear surface of the light guiding member 24, enables the light to be incident again to the light guiding member 24.

Two units of the light emitting diode module 26 are provided and are disposed in an opposed manner to each other at two side surfaces of four side surfaces of the light guiding member 24 that are symmetrical to each other. Each of the light emitting diode modules 26 includes a plurality of light emitting diodes 261 that emit light, and a printed circuit board 262, on which the plurality of light emitting diodes 261 are disposed, and a conductive pattern is formed to deliver electrical signals to the plurality of light emitting diodes 261. In the present exemplary embodiment, the light emitting diode modules 26 are disposed at both sides, that is, at the left and right sides, of the light guiding member 24.

The top chassis 40 is provided with a bezel part 41 to surround and support a rim of the display panel 10, and a top lateral side part 42, bent from one end of the bezel part 41, and installed at a lateral side of the middle mold 30.

Figure 2:
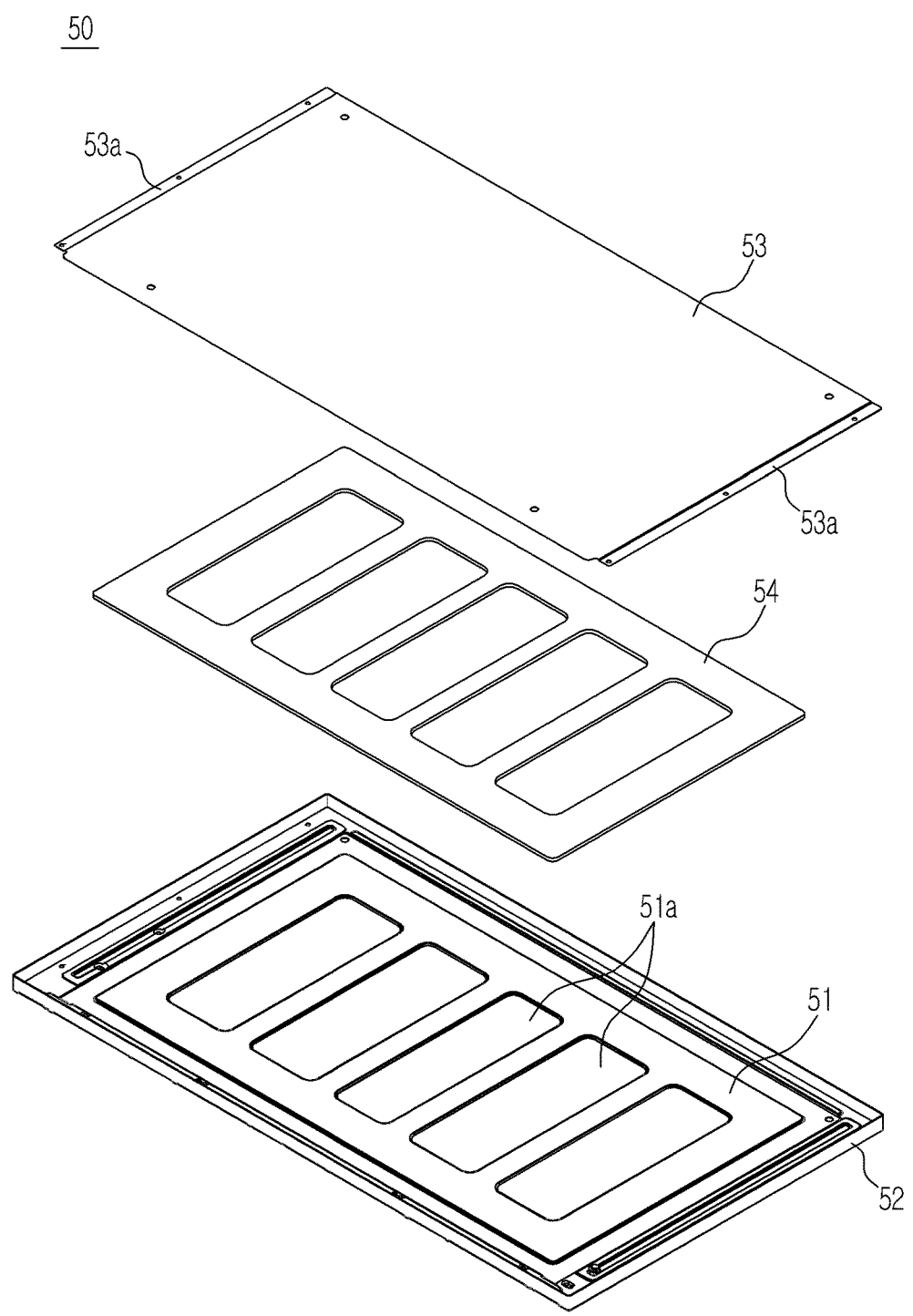
FIG. 2 is an exploded perspective view of a bottom chassis of the display module according to an exemplary embodiment.

The bottom chassis 50 is formed of metallic material, such as aluminum, to radiate heat as illustrated on FIG. 2, and includes a rear side part 51 on which the backlight unit 20 is placed, and a bottom lateral side part 52 extended toward a front side from a circumference of the rear side part 51.

In addition, at the rear side part 51 of the bottom chassis 50, a bead part 51a, configured to increase the strength of the bottom chassis 50, is provided. The bead part 51a is formed by regularly depressing some portions of the rear side part 51 of the bottom chassis 50 toward a rear side. The bead part 51a as such realizes the same effect as if the thickness of the bottom chassis 50 were partially thickened, thereby increasing the strength of the bottom chassis 50. The bead part 51a is elongated in upper and lower side directions, and the plurality of the bead parts 51a are formed at the bottom chassis 50 while being spaced apart from each other in the left and right directions of the bottom chassis 50. In the present exemplary embodiment, the five bead parts 51a are formed to be spaced apart from one another and in parallel to each other in the left and right directions of the bottom chassis 50.

With respect to the plurality of bead parts 51a formed as discussed above, the strength of the bottom chassis 50 is increased as the depths of the bead parts 51a are increased.

However, the thicknesses of the front and rear directions of the display module 100 is increased by the bead parts 51a.

Thus, in order to form the display module 100 with a small thickness (i.e., a slim/thin profile), the thickness of each bead part 51a is limited to be less than a certain thickness. Additionally, the bottom chassis 50 includes a reinforcing panel 53 attached to a front surface of the rear side part 51 of the bottom chassis 50 to increase the strength of the bottom chassis 50.

Both end portions of the reinforcing panel 53 are provided with fixing parts 53a configured to fix the both side end portions to the rear side part 51 of the bottom chassis 50 by use of screws. In addition, the reinforcing member 53, just as the bottom chassis 50, may be formed of metallic material, such as aluminum. The reinforcing panel 53 may be formed of the same material as the bottom chassis 50, so that the reinforcing panel 53 may thermally expand in a same manner as the bottom chassis 50.

The reinforcing panel 53 is attached to a front surface of the rear side part 51 of the bottom chassis 50, but is attached in a way to maintain a state of being spaced apart from the bead parts 51a. In an exemplary embodiment, the reinforcing member 53 is attached to the front surface of the rear side part 51 through a double-side tape 54 that is attached to cover the entire area adjacent to the bead parts 51a. Alternatively, the reinforcing panel 53 could be attached to a rear surface of the rear side part 51 of the bottom chassis.

Generally, the strength needed to stretch a metallic panel is far greater than the strength needed to bend the same metallic panel.

Figure 3:
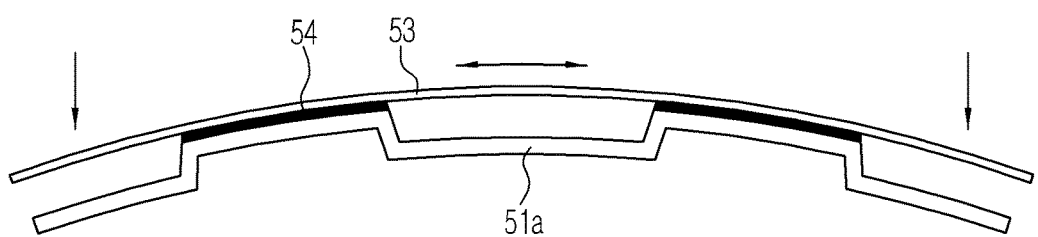
FIG. 3 is a cross-sectional view of the bottom chassis of the display module according to an exemplary embodiment.

Thus, as the reinforcing panel 53 is attached to the bottom chassis 50 at which the bead parts 51a are formed, as illustrated on FIG. 3, the strength being applied to bend the bottom chassis 50 serves as the strength to stretch the reinforcing panel 53. As described above, since greater strength is needed to stretch a metallic panel as described above, even if the stretch is performed, the stretching is performed within a small range. Thus, the bottom chassis 50 is not easily bent, even when a large bending force is applied. Accordingly, the strength of the bottom chassis 50 is further increased.

Figure 4:
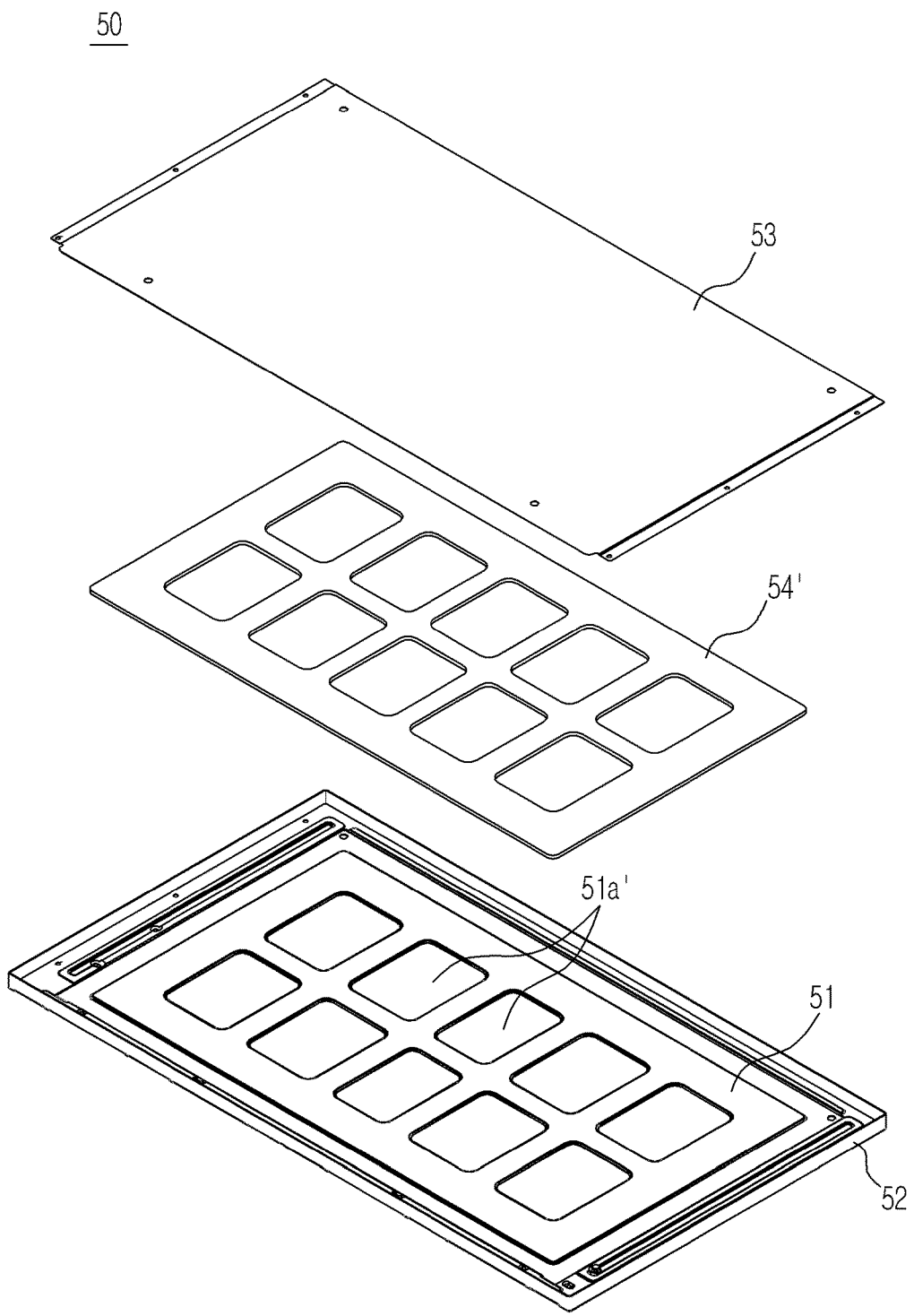
FIG. 4 is an exploded perspective view of a bottom chassis according to an exemplary embodiment.

In an exemplary embodiment, the bead parts 51a are elongated in upper and lower side directions, while being spaced apart from each other in left and right directions, but the exemplary embodiments are not limited hereto. For example, bead parts 51a' may be disposed on the rear side part 51 of the bottom chassis 50 while being spaced apart from one another in upper and lower side directions, as well as in left and right directions, as illustrated on FIG. 4. That is, each group of the total of five bead parts 51a' may be formed at an upper portion and at a lower portion of the rear side part 51 of the bottom chassis 50 while being spaced apart from one another and in parallel to one another. Thus, at the rear side part 51 of the bottom chassis 50, the ten bead parts 51a' are formed.

In the present exemplary embodiment, the reinforcing panel 53 is attached to the front surface of the rear side part 51 of the bottom chassis 50 through a double-side tape 54', but the exemplary embodiments are not limited hereto. For example, as discussed above, the reinforcing panel 53 may also be attached to the rear surface of the rear side part 51 of the bottom chassis. Furthermore, with respect to the front surface of the rear side part 51, an adhesive applied to cover the entire area adjacent to the bead parts 51a, the reinforcing panel 53 may be attached to the front surface of the rear side part 51 of the bottom chassis 50.

In the present exemplary embodiment, the bead parts 51a are elongated in upper and lower directions, but the exemplary embodiments are not limited hereto. For example, various shapes of bead parts may be formed at a rear side part of the bottom chassis and a reinforcing panel attached to a portion adjacent to the bead parts of the rear surface part, thereby attaining the same applicable effect.

The above description in accordance with the exemplary embodiments is made in relation to a display module, which is provided with a display panel that is formed using a liquid crystal display panel, and thus needed to be provided with a backlight unit. However, this is only exemplary, and the exemplary embodiments are not limited hereto. The exemplary embodiments may also be applied to a bottom chassis of a display module which is provided with a display panel that is formed using an organic light emitting diode panel which does not require a backlight.

Although a few embodiments of the present disclosure have been shown and described, it would be appreciated by those skilled in the art that changes may be made in these embodiments without departing from the principles and spirit of the disclosure, the scope of which is defined in the claims and their equivalents.

What is claimed is:

1. A display apparatus comprising:
   an organic light emitting diode panel;
   a chassis disposed at a rear side of the organic light emitting diode panel; and
   a panel attached to a front surface of the chassis through an adhesive material,
   wherein the chassis includes a plurality of depressed portions spaced apart from a rear surface of the panel, and
   wherein each of the plurality of depressed portions comprises a side wall portion and a bottom portion.

2. The display apparatus of claim 1, wherein the adhesive material comprises a double-sided tape.

3. The display apparatus of claim 2, wherein the panel is attached to an entire area of the front surface of the chassis, except for the plurality of depressed portions, through the double-sided tape.

4. The display apparatus of claim 2, wherein the double-sided tape is not attached to the plurality of depressed portions.

5. The display apparatus of claim 1, wherein the plurality of depressed portions are spaced apart from each other at regular intervals.

6. The display apparatus of claim 1, wherein each of the plurality of depressed portions extends in upper and lower side directions, and
   the plurality of the depressed portions are spaced apart from each other in left and right side directions.

7. The display apparatus of claim 1, wherein the plurality of the depressed portions are spaced apart from each other in left and right side directions and upper and lower side directions.

8. The display apparatus of claim 1, wherein the chassis and the panel are formed of a metallic material.

9. The display apparatus of claim 8, wherein the panel is configured to reinforce a strength of the chassis.

10. The display apparatus of claim 8, wherein the panel is configured to radiate heat generated by the display apparatus.

11. The display apparatus of claim 1, wherein the chassis and the panel are formed of a same material so that the panel thermally expands in a same manner as the chassis.

12. A display apparatus comprising:
an organic light emitting diode panel;
a chassis; and
a panel provided between the organic light emitting diode panel and the chassis, the panel being directly attached to a surface of the chassis through an adhesive material,
wherein the surface of chassis includes at least one depressed portion that is depressed in a direction extending away from the panel.

13. The display apparatus of claim 12, wherein the adhesive material comprises a double-sided tape.

14. The display apparatus of claim 13, wherein the double-sided tape is not attached to the at least one depressed portion.

15. The display apparatus of claim 12, wherein the panel is not attached to the surface of the chassis, through the adhesive material, at the at least one depressed portion.

16. The display apparatus of claim 13, wherein the panel is attached to an entire area of the surface of the chassis, except for the at least one depressed portion, through the double-sided tape.

* * * * *